(12) United States Patent
Cho et al.

(10) Patent No.: US 12,498,174 B2
(45) Date of Patent: Dec. 16, 2025

(54) SUBSTRATE PROCESSING APPARATUS

(71) Applicant: SEMES CO., LTD., Cheonan-si (KR)

(72) Inventors: Juyeon Cho, Suwon-si (KR);
Youngjun Lee, Cheonan-si (KR);
Kwangsoo Kim, Cheonan-si (KR);
Kisang Eum, Cheonan-si (KR);
Wooram Lee, Seoul (KR); Jongwha Kang, Cheonan-si (KR); Younghun Jung, Cheonan-si (KR); Junghyun Lee, Cheonan-si (KR); Dongwoon Park, Seoul (KR); Sunwook Jung, Hwaseong-si (KR)

(73) Assignee: Semes Co., LTD., Chungcheongnam-do (KR)

( * ) Notice: Subject to any disclaimer, the term of this patent is extended or adjusted under 35 U.S.C. 154(b) by 412 days.

(21) Appl. No.: 18/147,524

(22) Filed: Dec. 28, 2022

(65) Prior Publication Data

US 2023/0213283 A1 Jul. 6, 2023

(30) Foreign Application Priority Data

Dec. 31, 2021 (KR) .................. 10-2021-0194110

(51) Int. Cl.
*H01L 21/67* (2006.01)
*F27B 17/00* (2006.01)
(Continued)

(52) U.S. Cl.
CPC ........ *F27B 17/0025* (2013.01); *F27D 1/1858* (2013.01); *F27D 5/0037* (2013.01);
(Continued)

(58) Field of Classification Search
CPC ............ F27B 17/0025; H01L 21/6719; H01L 21/67126; H01L 21/67173; H01L 21/67178; H01L 21/67098
See application file for complete search history.

(56) References Cited

U.S. PATENT DOCUMENTS

| | | | |
|---|---|---|---|
| 6,402,401 B1 | 6/2002 | Ueda et al. | |
| 2021/0039131 A1* | 2/2021 | Shimmura | .............. B05B 14/30 |

FOREIGN PATENT DOCUMENTS

| | | |
|---|---|---|
| JP | 2001-189368 A | 7/2001 |
| JP | 2005-093950 A | 4/2005 |

(Continued)

OTHER PUBLICATIONS

Office Action for Japanese Application No. 2022-201172 dated Jan. 16, 2024.

(Continued)

*Primary Examiner* — Gregory A Wilson
(74) *Attorney, Agent, or Firm* — Harness, Dickey & Pierce, P.L.C.

(57) ABSTRACT

A substrate processing apparatus includes a bake chamber, a chamber door that opens and closes an opening of the bake chamber, a first support plate in the bake chamber, a first partition wall, which partitions a space provided on the first support plate into first heat treatment spaces spaced apart from each other in a first horizontal direction, and extends in a second horizontal direction and a vertical direction, first heat treatment modules arranged in the first heat treatment spaces, a first exhaust duct extending in the first horizontal direction across the first heat treatment spaces, a first sealing bracket coupled to the first exhaust duct, a first horizontal packing configured to seal a gap between the first sealing (Continued)

bracket and the chamber door, and a first vertical packing configured to seal a gap between the first partition wall and the chamber door.

20 Claims, 9 Drawing Sheets

(51) Int. Cl.
    *F27D 1/18*     (2006.01)
    *F27D 5/00*     (2006.01)
    *F27D 9/00*     (2006.01)
    *F27D 17/30*     (2025.01)

(52) U.S. Cl.
    CPC ............... *F27D 9/00* (2013.01); *F27D 17/30* (2025.01); *H01L 21/67103* (2013.01); *F27D 2009/007* (2013.01)

(56) References Cited

FOREIGN PATENT DOCUMENTS

| | | | |
|---|---|---|---|
| JP | 2010-123871 A | | 6/2010 |
| JP | 2011529136 A | * | 12/2011 |
| JP | 2015-035586 A | | 2/2015 |
| KR | 20090002933 A | * | 1/2009 |
| KR | 20100010866 A | * | 2/2010 |
| KR | 20140122387 A | * | 10/2014 |
| KR | 10-20170055819 A | | 5/2017 |
| KR | 101787367 B1 | | 10/2017 |
| KR | 101838793 B1 | | 3/2018 |
| KR | 10-2018-0122519 A | | 11/2018 |
| KR | 10-2019-0009701 A | | 1/2019 |
| KR | 102139614 B1 | | 7/2020 |
| KR | 10-2021-0031615 A | | 3/2021 |
| KR | 10-20210081491 A | | 7/2021 |

OTHER PUBLICATIONS

Korean Office Action, dated Aug. 30, 2023, issued in corresponding Korean Patent Application No. 10-2021-0194110.

* cited by examiner

SUBSTRATE PROCESSING APPARATUS

CROSS-REFERENCE TO RELATED APPLICATION

This application is based on and claims priority under 35 U.S.C. § 119 to Korean Patent Application No. 10-2021-0194110, filed on Dec. 31, 2021, in the Korean Intellectual Property Office, the disclosure of which is incorporated by reference herein in its entirety.

BACKGROUND

1. Field

The disclosure relates to a substrate processing apparatus.

2. Description of the Related Art

In fabrication of a semiconductor, a photolithography process is to form a desired pattern on a substrate, such as a wafer. A system for performing a photolithography process sequentially or selectively performs a coating process, a bake process, and a development process. Here, in a bake chamber used for the bake process, the substrate is cooled or heated. A plurality of processing spaces are provided in the bake chamber in which the airflow changes according to the progress of the process performed in the bake chamber, and there is an issue that the process atmosphere (e.g., temperature, pressure, humidity, etc.) of the plurality of processing spaces becomes nonuniform depending on the airflow in the bake chamber, and the reliability of substrate processing is deteriorated.

SUMMARY

Provided is a substrate processing apparatus having improved reliability of substrate processing.

Additional aspects will be set forth in part in the description which follows and, in part, will be apparent from the description, or may be learned by practice of the presented embodiments of the disclosure.

According to an aspect of the disclosure, a substrate processing apparatus includes a bake chamber, a chamber door that opens and closes an opening of the bake chamber, a first support plate provided in the bake chamber, a first partition wall, which partitions a space provided on the first support plate into first heat treatment spaces spaced apart from each other in a first horizontal direction, and extends on the first support plate in a second horizontal direction and a vertical direction, wherein the second horizontal direction is perpendicular to the first horizontal direction, and the vertical direction is perpendicular to the first horizontal direction and the second horizontal direction, first heat treatment modules, which are arranged in the first heat treatment spaces and include first heating stages on which substrates are mounted, respectively, a first exhaust duct extending in the first horizontal direction across the first heat treatment spaces and through which gas exhausted from the first heat treatment modules is introduced, a first sealing bracket, which is coupled to the first exhaust duct and extends in the first horizontal direction along the first exhaust duct, a first horizontal packing, which extends in the first horizontal direction along the first sealing bracket and is configured to seal a gap between the first sealing bracket and the chamber door, and a first vertical packing, which extends in the vertical direction along an edge of the first partition wall facing the chamber door and is configured to seal a gap between the first partition wall and the chamber door.

According to another aspect of the disclosure, a substrate processing apparatus includes a bake chamber, a chamber door that opens and closes an opening of the bake chamber, a first support plate provided in the bake chamber, a heating unit, which is arranged in a first heat treatment space provided on the first support plate and includes a first heating stage configured to heat a substrate and a first heating chamber accommodating the first heating stage, a first exhaust duct, which is connected to a first exhaust pipe connected to an upper side of the first heating chamber and discharges gas introduced through the first exhaust pipe to the outside, a second exhaust duct, which is provided on one side of the first exhaust duct and includes a plurality of communicating holes that communicate between the first heat treatment space and an inner flow path provided in the second exhaust duct, a connection pipe, which extends between the second exhaust duct and the first heating chamber to communicate between the inner flow path of the second exhaust duct and a space in the first heating chamber, a sealing bracket, which is coupled to one side of the first exhaust duct facing the chamber door and extends in a direction in which the first exhaust duct extends, and a horizontal packing, which extends along the sealing bracket and is configured to seal a gap between the sealing bracket and the chamber door.

According to another aspect of the disclosure, a substrate processing apparatus includes a bake chamber, a chamber door that opens and closes an opening of the bake chamber, a first support plate provided in the bake chamber, a first partition wall, which partitions a space provided on the first support plate into first heat treatment spaces spaced apart from each other in a first horizontal direction, and extends on the first support plate in a second horizontal direction and a vertical direction, wherein the second horizontal direction is perpendicular to the first horizontal direction, and the vertical direction is perpendicular to the first horizontal direction and the second horizontal direction, first heat treatment modules, which are arranged in the first heat treatment spaces, each of the first heat treatment modules including a first cooling stage configured to cool a substrate and a first heating stage configured to heat the substrate, a first exhaust duct extending in the first horizontal direction across the first heat treatment spaces and through which gas exhausted from the first heat treatment modules is introduced, a second exhaust duct, which extends in the first horizontal direction across the first heat treatment spaces and includes a plurality of communicating holes that communicate between a flow path provided in the second exhaust duct and the first heat treatment spaces, a first sealing bracket, which is coupled to the first exhaust duct and extends in the first horizontal direction along the first exhaust duct, a first horizontal packing, which extends in the first horizontal direction along the first sealing bracket and is configured to seal a gap between the first sealing bracket and the chamber door, a first vertical packing, which extends in the vertical direction along an edge of the first partition wall facing the chamber door and is configured to seal a gap between the first partition wall and the chamber door, a second support plate provided below the first support plate, a second partition wall, which partitions a space provided between the first support plate and the second support plate into second heat treatment spaces spaced apart from each other in the first horizontal direction, and extends in the second horizontal direction and the vertical direction, second heat treatment modules, which are arranged in the second heat treatment spaces, and each include a second cooling stage configured to cool a substrate and a second heating stage configured to heat the substrate, and a second vertical packing, which extends in the vertical direction along an edge of the second partition wall facing the chamber door and is configured to seal a gap between the second partition wall and the chamber door.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
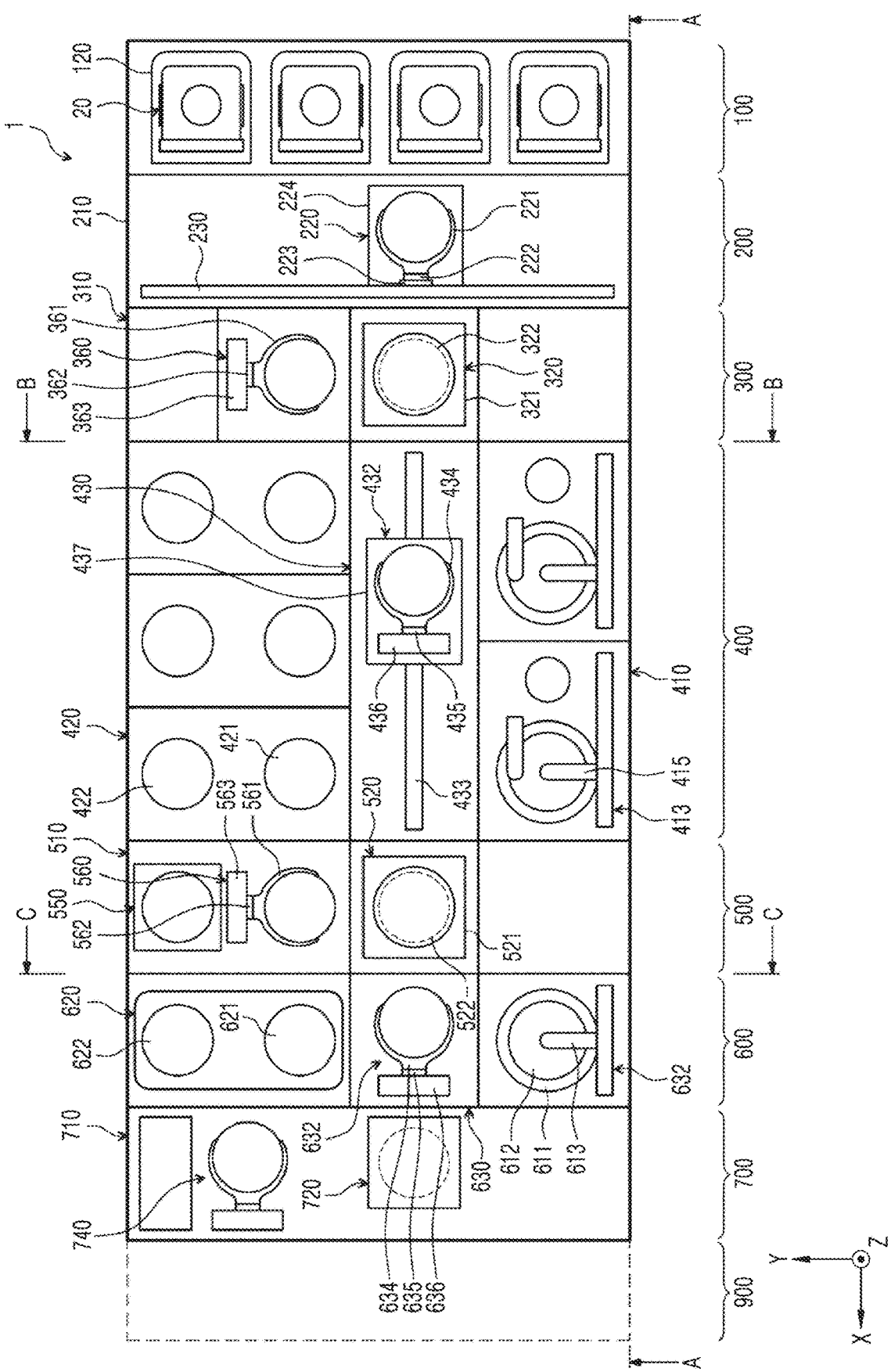
FIG. 1 is a plan view schematically illustrating a substrate processing apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. The same reference numerals are used for the same components in the drawings, and redundant descriptions thereof will be omitted.

Figure 2:
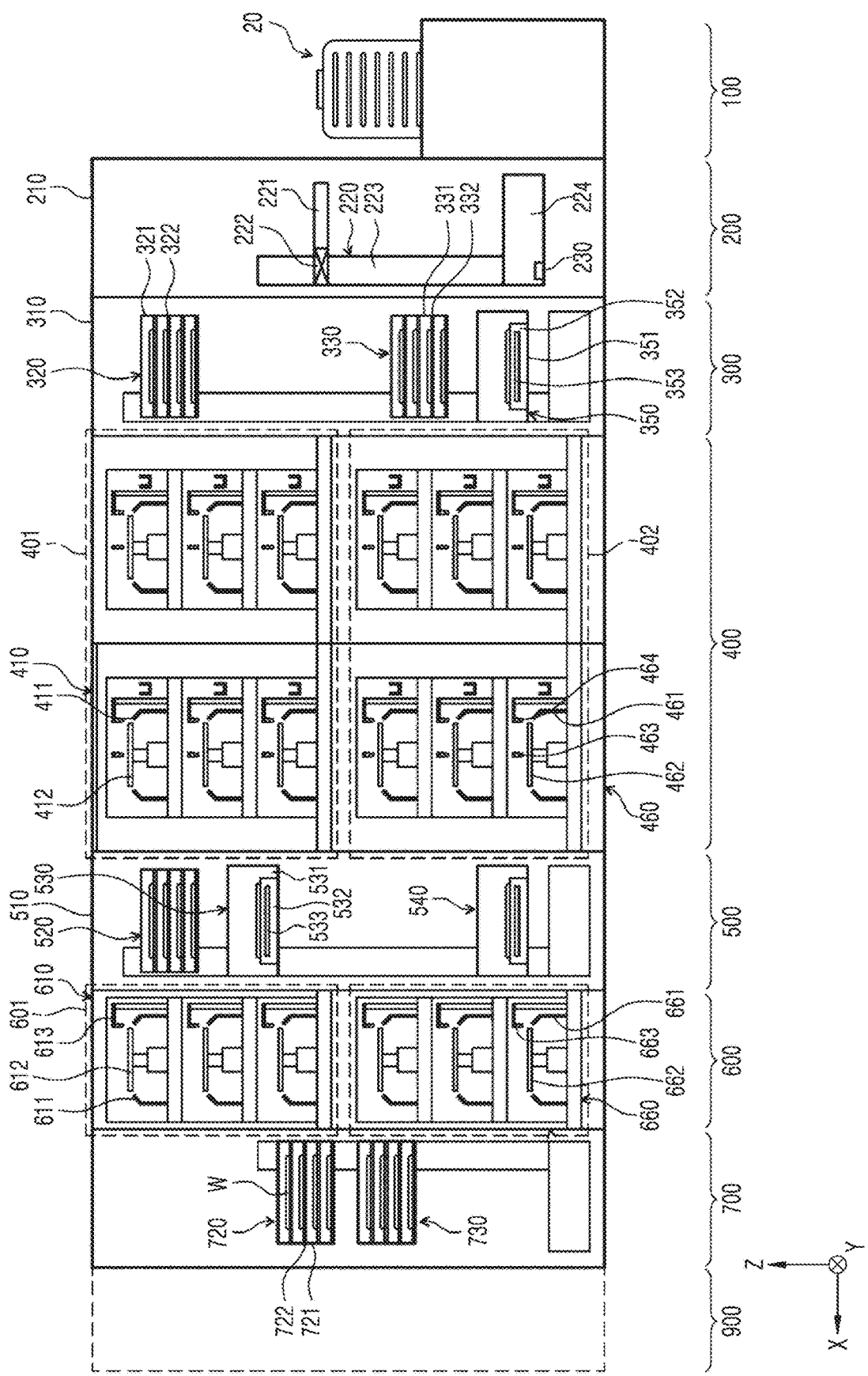
FIG. 2 is a diagram of the substrate processing apparatus of FIG. 1, taken along line A-A.
Figure 3:
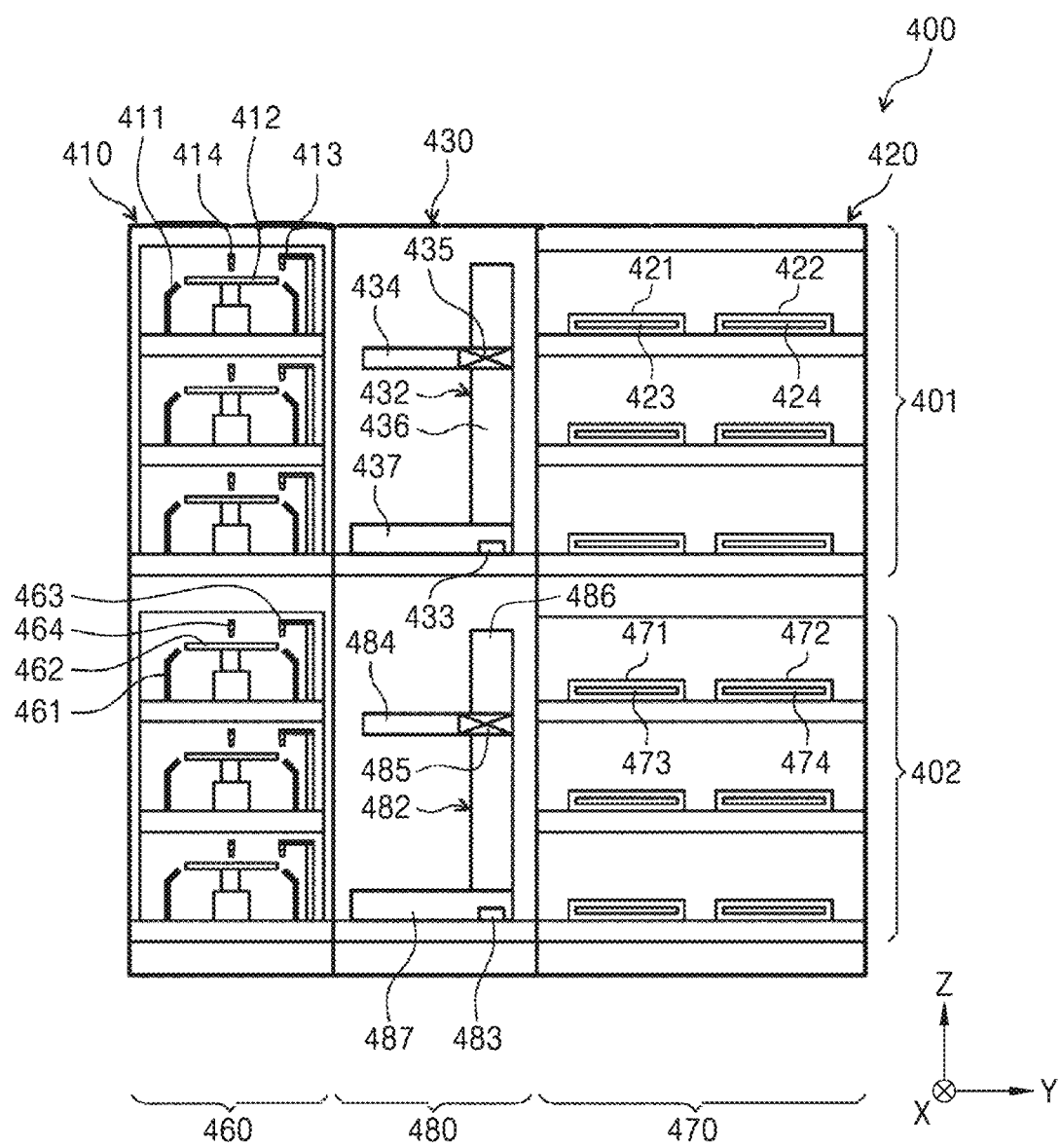
FIG. 3 is a diagram of the substrate processing apparatus of FIG. 1, taken along line B-B.
Figure 4:
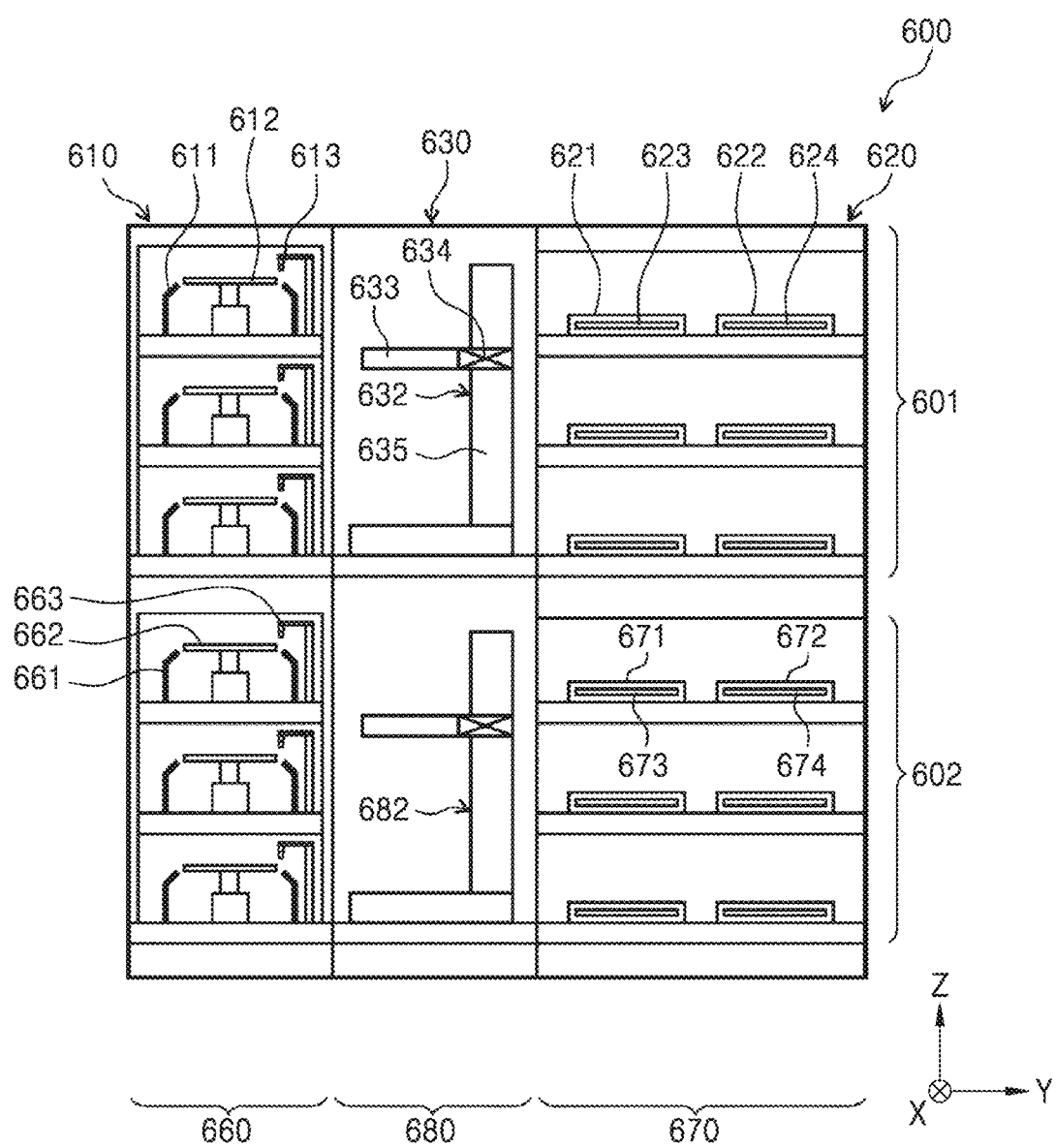
FIG. 4 is a diagram of the substrate processing apparatus of FIG. 1, taken along line C-C.

FIG. 1 is a plan view schematically illustrating a substrate processing system 1 according to an embodiment. FIG. 2 is a diagram of the substrate processing system 1 of FIG. 1, taken along line A-A, FIG. 3 is a diagram of the substrate processing system 1 of FIG. 1, taken along line B-B, and FIG. 3 is a diagram of the substrate processing system 1 of FIG. 1, taken along line C-C.

Referring to FIGS. 1 to 4, the substrate processing system 1 includes a load port 100, an index module 200, a first buffer module 300, a coating and developing module 400, a second buffer module 500, a pre- and post-exposure processing module 600, and an interface module 700. The load port 100, the index module 200, the first buffer module 300, the coating and developing module 400, the second buffer module 500, the pre- and post-exposure processing module 600, and the interface module 700 are sequentially arranged in a line and in one direction.

Hereinafter, the direction in which the load port 100, the index module 200, the first buffer module 300, the coating and developing module 400, the second buffer module 500, the pre- and post-exposure processing module 600, and the interface module 700 are arranged is referred to as a first horizontal direction X, a direction perpendicular to the first horizontal direction X when viewed from above is referred to as a second horizontal direction Y, and a direction perpendicular to the first horizontal direction X and the second horizontal direction Y is referred to as a vertical direction Z.

A substrate W is moved while being accommodated in a cassette 20. Here, the cassette 20 has a structure that may be sealed from the outside. For example, the cassette 20 may be a front-opening unified pod (FOUP) having a door at the front thereof.

The load port 100 has a mounting table 120 on which the cassette 20 in which the substrates W are accommodated is placed. A plurality of mounting tables 120 are provided, and the mounting tables 120 are arranged in a line in the second horizontal direction Y. FIG. 1 illustrates that four mounting tables 120 are provided.

The index module 200 transfers the substrate W between the cassette 20 placed on the mounting table 120 of the load port 100 and the first buffer module 300. The index module 200 has a frame 210, an index robot 220, and a guide rail 230. The frame 210 is provided in the shape of a substantially hollow rectangular parallelepiped, and is arranged between the load port 100 and the first buffer module 300. The frame 210 of the index module 200 may be provided at a lower height than that of a frame 310 of the first buffer module 300 to be described below. The index robot 220 and the guide rail 230 are arranged in the frame 210. The index robot 220 has a 4-axis driven structure such that a hand 221 that directly handles the substrate W is movable and rotatable in the first horizontal direction X, the second horizontal direction Y, and the vertical direction Z. The index robot 220 has the hand 221, an arm 222, a support 223, and a holder 224. The hand 221 is installed to be fixed to the arm 222. The arm 222 is provided in an extendible and rotatable structure. The support 223 is arranged such that the lengthwise direction thereof is in the vertical direction Z. The arm 222 is coupled to the support 223 so as to be movable along the support 223. The support 223 is fixedly coupled to the holder 224. The guide rail 230 is provided such that the lengthwise direction thereof is arranged in the second horizontal direction Y. The holder 224 is coupled to the guide rail 230 so as to be linearly movable along the guide rail 230. In addition, although not illustrated, a door opener that opens and closes the door of the cassette 20 is further provided in the frame 210.

The first buffer module 300 includes the frame 310, a first buffer 320, a second buffer 330, a cooling chamber 350, and a first buffer robot 360. The frame 310 is provided in the shape of a hollow rectangular parallelepiped, and is arranged between the index module 200 and the coating and developing module 400. The first buffer 320, the second buffer 330, the cooling chamber 350, and the first buffer robot 360 are positioned within the frame 310. The cooling chamber 350, the second buffer 330, and the first buffer 320 are sequentially arranged in the vertical direction Z from the bottom. The first buffer 320 is positioned at a height corresponding to a coating module 401 of the coating and developing module 400 to be described below, and the second buffer 330 and the cooling chamber 350 are positioned at a height corresponding to a developing module 402 of the coating and developing module 400 to be described below. The first buffer robot 360 is spaced apart from the second buffer 330, the cooling chamber 350, and the first buffer 320 by a preset distance in the second horizontal direction Y.

The first buffer 320 and the second buffer 330 each temporarily store the plurality of substrates W. The second buffer 330 has a housing 331 and a plurality of supports 332. The supports 332 are arranged within the housing 331 and are spaced apart from each other in the vertical direction Z. One substrate W is placed on each support 332. The housing 331 has openings (not shown) on a side on which the index robot 220 is provided, on a side on which the first buffer robot 360 is provided, and on a side on which a developing robot 482 of the developing module 402 to be described below is provided, such that the index robot 220, the first buffer robot 360, and the developing robot 482 carry the substrate W into or out of the support 332 in the housing 331. The first buffer 320 has a structure substantially similar to that of the second buffer 330. However, a housing 321 of the first buffer 320 has openings on a side on which the first buffer robot 360 is provided, and on a side on which a coating robot 432 positioned in the coating module 401 to be described below is provided. The number of supports 322 provided in the first buffer 320 and the number of supports 332 provided in the second buffer 330 may be equal to or different from each other. According to an example, the number of supports 332 provided in the second buffer 330 may be greater than the number of supports 322 provided in the first buffer 320.

The first buffer robot 360 transfers the substrate W between the first buffer 320 and the second buffer 330. The first buffer robot 360 has a hand 361, an arm 362, and a support 363. The hand 361 is installed to be fixed to the arm 362. The arm 362 is provided in an extendible structure such that the hand 361 is movable in the second horizontal direction Y. The arm 362 is coupled to the support 363 so as to be linearly movable in the vertical direction Z along the support 363. The support 363 has a length extending from a position corresponding to the second buffer 330 to a position corresponding to the first buffer 320. The support 363 may be provided to extend longer upward or downward. The first buffer robot 360 may be provided such that the hand 361 is simply two-axis driven in the second horizontal direction Y and the vertical direction Z.

The cooling chamber 350 cools the substrate W. The cooling chamber 350 has a housing 351 and a cooling plate 352. The cooling plate 352 has an upper surface on which the substrate W is placed, and a cooler 353 that cools the substrate W. Various cooling methods, such as cooling using cooling water or cooling using a thermoelectric element, may be used for the cooler 353. In addition, a lift pin assembly (not shown) that places the substrate W on the cooling plate 352 may be provided in the cooling chamber 350. The housing 351 has openings (not shown) on a side on which the index robot 220 is provided and on a side on which the developing robot 482 of the developing module 402 to be described below is provided, such that the index robot 220 and the developing robot 482 carry the substrate W into or out of the cooling plate 352. In addition, doors (not shown) may be provided in the cooling chamber 350 to open and close the above-described openings.

The coating and developing module 400 performs a process of coating a photoresist on the substrate W before an exposure process, and performs a process of developing the substrate W after the exposure process. The coating and developing module 400 has a substantially rectangular parallelepiped shape. The coating and developing module 400 has the coating module 401 and the developing module 402. The coating module 401 and the developing module 402 are arranged to be partitioned from each other in different layers. According to an example, the coating module 401 is positioned on the developing module 402.

The coating module 401 performs a process of coating a photosensitive liquid, such as a photoresist, on the substrate W, and a heat treatment process, such as heating and cooling the substrate W before and after a resist coating process. The coating module 401 includes a resist coating unit 410, a bake unit 420, and a transfer chamber 430. The resist coating unit 410, the transfer chamber 430, and the bake unit 420 are sequentially arranged in the second horizontal direction Y. Accordingly, the resist coating unit 410 and the bake unit 420 are spaced apart from each other in the second horizontal direction Y with the transfer chamber 430 therebetween. A plurality of resist coating units 410 are provided in each of the first horizontal direction X and in the vertical direction Z. A plurality of bake units 420 are provided in each of the first horizontal direction X and the vertical direction Z.

The transfer chamber 430 is positioned parallel to the first buffer 320 of the first buffer module 300 in the first horizontal direction X. The coating robot 432 and a guide rail 433 are positioned in the transfer chamber 430. The transfer chamber 430 has a substantially rectangular shape. The coating robot 432 transfers the substrate W between the bake units 420, the resist coating units 400, the first buffer 320 of the first buffer module 300, and a first cooling chamber 520 of the second buffer module 500 to be described below. The guide rail 433 is arranged such that the lengthwise direction thereof is parallel to the first horizontal direction X. The guide rail 433 guides the coating robot 432 to linearly move in the first horizontal direction X. The coating robot 432 has a hand 434, an arm 435, a support 436, and a holder 437. The hand 434 is installed to be fixed to the arm 435. The arm 435 is provided in an extendible structure such that the hand 434 is movable in the horizontal direction. The support 436 is provided such that the lengthwise direction thereof is arranged in the vertical direction Z. The arm 435 is coupled to the support 436 so as to be linearly movable in the vertical direction Z along the support 436. The support 436 is fixedly coupled to the holder 437, and the holder 437 is coupled to the guide rail 433 so as to be movable along the guide rail 433.

The resist coating units 410 all have the same structure. However, the types of photosensitive liquids used by the respective resist coating units 410 may be different from each other. For example, a chemically amplified resist may be used as the photosensitive liquid. The resist coating unit 410 coats the photosensitive liquid on the substrate W. The resist coating unit 410 has a housing 411, a support plate 412, and a nozzle 413. The housing 411 has a cup shape with an open top. The support plate 412 is positioned in the housing 411 and supports the substrate W. The support plate 412 is provided to be rotatable. The nozzle 413 supplies the photosensitive liquid onto the substrate W placed on the support plate 412. The nozzle 413 may have a circular tubular shape and supply the photosensitive liquid to the center of the substrate W. Optionally, the nozzle 413 may have a length corresponding to the diameter of the substrate W, and an outlet of the nozzle 413 may be provided as a slit. In addition, a nozzle 414 that supplies a cleaning solution, such as deionized water, to clean the surface of the substrate W coated with the photosensitive liquid may be additionally provided in the resist coating unit 410.

The bake unit 420 heat-treats the substrate W. The bake unit 420 heat-treats the substrate W before and after applying the photosensitive liquid. The bake unit 420 may heat the substrate W to a preset temperature in order to change the surface properties of the substrate W before coating the photosensitive liquid, and form a treatment liquid film, such as an adhesive, on the substrate W. The bake unit 420 heat-treats the substrate W coated with the photosensitive liquid, in a reduced pressure atmosphere to volatilize volatile substances included in the photosensitive liquid film.

The bake unit 420 includes a cooling stage 421 and a heating unit 422. The cooling stage 421 cools the substrate W heat-treated by the heating unit 422. The cooling stage 421 is provided in a circular plate shape. A cooler, such as cooling water or a thermoelectric element, is provided in the cooling stage 421. For example, the substrate W placed on the cooling stage 421 may be cooled to a temperature equal to or close to the room temperature. The heating unit 422 heats the substrate W. The heating unit 422 heats the substrate W in the atmosphere of a normal pressure or a reduced pressure lower that normal pressure.

The developing module 402 performs a developing process for removing a part of the photoresist by supplying a developing solution to obtain a pattern on the substrate W, and a heat treatment process, such as heating and cooling performed on the substrate W before and after the developing process. The developing module 402 includes a developing unit 460, a bake unit 470, and a transfer chamber 480. The developing unit 460, the transfer chamber 480, and the bake unit 470 are sequentially arranged in the second horizontal direction Y. Accordingly, the developing unit 460 and the bake unit 470 are spaced apart from each other in the second horizontal direction Y with the transfer chamber 480 therebetween. A plurality of developing units 460 are provided in each of the first horizontal direction X and in the vertical direction Z. A plurality of bake units 470 are provided in each of the first horizontal direction X and the vertical direction Z.

The transfer chamber 480 is positioned parallel to the second buffer 330 of the first buffer module 300 in the first horizontal direction X. The developing robot 482 and a guide rail 483 are positioned in the transfer chamber 480. The transfer chamber 480 has a substantially rectangular shape. The developing robot 482 transfers the substrate W between the bake units 470, the developing units 460, the second buffer 330 and the cooling chamber 350 of the first buffer module 300, and a second cooling chamber 540 of the second buffer module 500. The guide rail 483 is arranged such that the lengthwise direction thereof is parallel to the first horizontal direction X. The guide rail 483 guides the developing robot 482 to linearly move in the first horizontal direction X. The developing robot 482 includes a hand 484, an arm 485, a support 486, and a holder 487. The hand 484 is installed to be fixed to the arm 485. The arm 485 is provided in an extendible structure such that the hand 484 is movable in the horizontal direction. The support 486 is provided such that the lengthwise direction thereof is arranged in the vertical direction Z. The arm 485 is coupled to the support 486 so as to be linearly movable in the vertical direction Z along the support 486. The support 486 is fixedly coupled to the holder 487. The holder 487 is coupled to the guide rail 483 so as to be movable along the guide rail 483.

The developing units 460 all have the same structure. However, the types of developing solutions used by the developing units 460 may be different from each other. The developing unit 460 removes a light-irradiated region of the photoresist on the substrate W. At this time, a light-irradiated region of a protective film is also removed. Depending on the type of a selectively used photoresist, only regions not irradiated with light among regions of the photoresist and the protective film may be removed.

The developing unit 460 has a housing 461, a support plate 462, and a nozzle 463. The housing 461 has a cup shape with an open top. The support plate 462 is positioned in the housing 461 and supports the substrate W. The support plate 462 is provided to be rotatable. The nozzle 463 supplies a developing solution onto the substrate W placed on the support plate 462. The nozzle 463 may have a circular tubular shape, and supply a developing solution to the center of the substrate W. Optionally, the nozzle 463 may have a length corresponding to the diameter of the substrate W, and an outlet of the nozzle 463 may be provided as a slit. In addition, a nozzle 464 that supplies a cleaning solution, such as deionized water, to clean the surface of the substrate W supplied with the developing solution may be additionally provided in the developing unit 460.

The bake unit 470 of the developing module 402 heat-treats the substrate W. For example, the bake units 470 perform a post-bake process of heating the substrate W before the developing process is performed, a hard bake process of heating the substrate W after the developing process is performed, and a cooling process of cooling the heated substrate W after each bake process. The bake unit 470 has a cooling stage 471 or a heating unit 472. A cooler 473, such as cooling water or a thermoelectric element, is provided in the cooling stage 471. Alternatively, a heater 474, such as a hot wire or a thermoelectric element, is provided in the heating unit 472. The cooling stage 471 and the heating unit 472 may be provided in one bake unit 470, respectively. Optionally, some of the bake units 470 may have only the cooling stage 471 and others may have only the heating unit 472. The bake unit 470 of the developing module 402 has the same configuration as that of the bake unit 420 of the coating module 401, and thus, a detailed description thereof will be omitted.

The second buffer module 500 is provided as a passage through which the substrate W is transferred between the coating and developing module 400 and the pre- and post-exposure processing module 600. In addition, the second buffer module 500 performs a certain process, such as a cooling process or an edge exposure process, on the substrate W. The second buffer module 500 has a frame 510, a buffer 520, a first cooling chamber 530, the second cooling chamber 540, an edge exposure chamber 550, and a second buffer robot 560. The frame 510 has a rectangular parallelepiped shape. The buffer 520, the first cooling chamber 530, the second cooling chamber 540, the edge exposure chamber 550, and the second buffer robot 560 are positioned in the frame 510. The buffer 520, the first cooling chamber 530, and the edge exposure chamber 550 are arranged at a height corresponding to the coating module 401. The second cooling chamber 540 is arranged at a height corresponding to the developing module 402. The buffer 520, the first cooling chamber 530, and the second cooling chamber 540 are sequentially arranged in a line in the vertical direction Z. When viewed from above, the buffer 520 is arranged along the transfer chamber 430 of the coating module 401 and the first horizontal direction X. The edge exposure chamber 550 is spaced apart from the buffer 520 or the first cooling chamber 530 by a preset distance in the second horizontal direction Y.

The second buffer robot 560 transfers the substrate W between the buffer 520, the first cooling chamber 530, and the edge exposure chamber 550. The second buffer robot 560 is positioned between the edge exposure chamber 550 and the buffer 520. The second buffer robot 560 may be provided in a structure similar to that of the first buffer robot 360. The first cooling chamber 530 and the edge exposure chamber 550 perform a subsequent process on the substrates W on which a process has been performed in the coating module 401. The first cooling chamber 530 cools the substrate W on which a process has been performed in the coating module 401. The first cooling chamber 530 has a structure similar to that of the cooling chamber 350 of the first buffer module 300. The edge exposure chamber 550 exposes the edges of the substrates W on which the cooling process has been performed in the first cooling chamber 530. The buffer 520 temporarily stores the substrates W on which a process has been performed in the edge exposure chamber 550, before the substrates W are transferred to a preprocessing module 601 to be described below. The second cooling chamber 540 cools the substrates W on which a process has been performed in a postprocessing module 602 to be described below, before the substrates W are transferred to the developing module 402. The second buffer module 500 may further have a buffer added at a height corresponding to the developing module 402. In this case, the substrates W on which a process has been performed in the postprocessing module 602 may be temporarily stored in the added buffer and then transferred to the developing module 402.

In a case in which an exposure apparatus 900 performs an immersion exposure process, the pre- and post-exposure processing module 600 may perform a process of coating a protective film to protect the photoresist film coated on the substrate W, during immersion exposure. Also, the pre- and post-exposure processing module 600 may perform a process of cleaning the substrate W after exposure. In addition, in a case in which the coating process is performed by using a chemically amplified resist, the pre- and post-exposure processing module 600 may perform a post-exposure bake process.

The pre- and post-exposure processing module 600 has the preprocessing module 601 and the postprocessing module 602. The preprocessing module 601 performs a process of treating the substrate W before performing an exposure process, and the postprocessing module 602 performs a process of treating the substrate W after the exposure process. The preprocessing module 601 and the postprocessing module 602 are arranged to be partitioned from each other in different layers. According to an example, the preprocessing module 601 is positioned on the postprocessing module 602. The preprocessing module 601 is provided at the same height as that of the coating module 401. The postprocessing module 602 is provided at the same height as that of the developing module 402. The preprocessing module 601 has a protective film coating unit 610, a bake unit 620, and a transfer chamber 630. The protective film coating unit 610, the transfer chamber 630, and the bake unit 620 are sequentially arranged in the second horizontal direction Y. Accordingly, the protective film coating unit 610 and the bake unit 620 are spaced apart from each other in the second horizontal direction Y with the transfer chamber 630 therebetween. A plurality of protective film coating units 610 are provided, and are arranged in the vertical direction Z so as to form different layers. Optionally, a plurality of protective film coating units 610 may be provided in each of the first horizontal direction X and the vertical direction Z. A plurality of bake units 620 are provided, and are arranged in the vertical direction Z so as to form different layers. Optionally, a plurality of bake units 620 may be provided in each of the first horizontal direction X and the vertical direction Z.

The transfer chamber 630 is positioned parallel to the first cooling chamber 530 of the second buffer module 500 in the first horizontal direction X. A preprocessing robot 632 is positioned in the transfer chamber 630. The transfer chamber 630 has a substantially square or rectangular shape. The preprocessing robot 632 transfers the substrate W between the protective film coating units 610, the bake units 620, the buffer 520 of the second buffer module 500, and a first buffer 720 of the interface module 700 to be described below. The preprocessing robot 632 has a hand 633, an arm 634, and a support 635. The hand 633 is installed to be fixed to the arm 634. The arm 634 is provided in an extendible and rotatable structure. The arm 634 is coupled to the support 635 so as to be linearly movable in the vertical direction Z along the support 635.

The protective film coating unit 610 coats a protective film on the substrate W to protect a resist film during immersion exposure. The protective film coating unit 610 has a housing 611, a support plate 612, and a nozzle 613. The housing 611 has a cup shape with an open top. The support plate 612 is positioned in the housing 611 and supports the substrate W. The support plate 612 is provided to be rotatable. The nozzle 613 supplies a protective liquid for forming a protective film, onto the substrate W placed on the support plate 612. The nozzle 613 may have a circular tubular shape and supply the protective liquid to the center of the substrate W. Optionally, the nozzle 613 may have a length corresponding to the diameter of the substrate W, and an outlet of the nozzle 613 may be provided as a slit. In this case, the support plate 612 may be provided as being fixed. The protective liquid includes a foamable material. A photoresist and a material having low affinity with water may be used as the protective liquid. For example, the protective liquid may include a fluorine-based solvent. The protective film coating unit 610 supplies the protective liquid to a central region of the substrate W while rotating the substrate W placed on the support plate 612.

The bake unit 620 heat-treats the substrate W coated with the protective film. The bake unit 620 has a cooling stage 621 or a heating plate 622. A cooler 623, such as cooling water or a thermoelectric element, is provided in the cooling stage 621. Alternatively, a heater 624, such as a hot wire or a thermoelectric element, is provided in the heating plate 622. The heating plate 622 and the cooling stage 621 may be provided in one bake unit 620, respectively. Optionally, some of the bake units 620 may have only the heating plate 622 and others may have only the cooling stage 621.

The postprocessing module 602 has a cleaning chamber 660, a post-exposure bake unit 670, and a transfer chamber 680. The cleaning chamber 660, the transfer chamber 680, and the post-exposure bake unit 670 are sequentially arranged in the second horizontal direction Y. Accordingly, the cleaning chamber 660 and the post-exposure bake unit 670 are spaced apart from each other in the second horizontal direction Y with the transfer chamber 680 therebetween. A plurality of cleaning chambers 660 are provided, and may be arranged in the vertical direction Z so as to form different layers. Optionally, a plurality of cleaning chambers 660 may be provided in each of the first horizontal direction X and the vertical direction Z. A plurality of post-exposure bake units 670 may be provided, and may be arranged in the vertical direction Z so as to form different layers. Optionally, a plurality of post-exposure bake units 670 may be provided in each of the first horizontal direction X and the vertical direction Z.

The transfer chamber 680 is positioned parallel to the second cooling chamber 540 of the second buffer module 500 in the first horizontal direction X when viewed from above. The transfer chamber 680 has a substantially square or rectangular shape. A postprocessing robot 682 is positioned in the transfer chamber 680. The postprocessing robot 682 transfers the substrate W between the cleaning chambers 660, the post-exposure bake units 670, the second cooling chamber 540 of the second buffer module 500, and a second buffer 730 of the interface module 700 to be described below. The postprocessing robot 682 provided in the postprocessing module 602 may have the same structure as that of the preprocessing robot 632 provided in the preprocessing module 601.

The cleaning chamber 660 cleans the substrate W after the exposure process. The cleaning chamber 660 has a housing 661, a support plate 662, and a nozzle 663. The housing 661 has a cup shape with an open top. The support plate 662 is positioned in the housing 661 and supports the substrate W. The support plate 662 is provided to be rotatable. The nozzle 663 supplies a cleaning solution onto the substrate W placed on the support plate 662. Water such as deionized water may be used as the cleaning solution. The cleaning chamber 660 supplies the cleaning solution to a central region of the substrate W while rotating the substrate W placed on the support plate 662. Optionally, while the substrate W is rotated, the nozzle 663 may linearly or rotationally move from the central region to the edge region of the substrate W.

The post-exposure bake unit 670 heats the substrate W on which the exposure process has been performed by using far ultraviolet rays. In the post-exposure bake process, a property change of the photoresist is completed by heating the substrate W to amplify acid generated in the photoresist by exposure. The post-exposure bake unit 670 has a heating plate 672. A heater 674, such as a hot wire or a thermoelectric element, is provided in the heating plate 672. The post-exposure bake unit 670 may further include a cooling stage 671 therein. A cooler 673, such as cooling water or a thermoelectric element, is provided in the cooling stage 671. Also, optionally, a bake unit having only the cooling stage 671 may be further provided.

As described above, in the pre- and post-exposure processing module 600, the preprocessing module 601 and the postprocessing module 602 are completely separated from each other. In addition, the transfer chamber 630 of the preprocessing module 601 and the transfer chamber 680 of the postprocessing module 602 may be provided to have the same size and completely overlap each other when viewed from above. In addition, the protective film coating unit 610 and the cleaning chamber 660 may be provided to have the same size and completely overlap each other when viewed from above. In addition, the bake unit 620 and the post-exposure bake unit 670 may be provided in the same size and completely overlap each other when viewed from above.

The interface module 700 transfers the substrate W between the pre- and post-exposure processing module 600 and the exposure apparatus 900. The interface module 700 has a frame 710, the first buffer 720, the second buffer 730, and an interface robot 740. The first buffer 720, the second buffer 730, and the interface robot 740 are positioned in the frame 710. The first buffer 720 and the second buffer 730 are spaced apart from each other by a preset distance and are arranged to be stacked on each other. The first buffer 720 is arranged higher than the second buffer 730. The first buffer 720 is positioned at a height corresponding to the preprocessing module 601, and the second buffer 730 is positioned at a height corresponding to the postprocessing module 602. When viewed from above, the first buffer 720 is arranged in a line with the transfer chamber 630 of the preprocessing module 601 in the first horizontal direction X, and the second buffer 730 is arranged in a line with the transfer chamber 630 of the postprocessing module 602 in the first horizontal direction X.

The interface robot 740 is positioned to be spaced apart from the first buffer 720 and the second buffer 730 in the second horizontal direction Y. The interface robot 740 transfers the substrate W between the first buffer 720, the second buffer 730, and the exposure apparatus 900. The interface robot 740 has a structure substantially similar to that of the second buffer robot 560.

The first buffer 720 temporarily stores the substrates W on which a process has been performed in the preprocessing module 601, before they are transferred to the exposure apparatus 900. Also, the second buffer 730 temporarily stores the substrates W on which a process has been performed in the exposure apparatus 900, before they are transferred to the postprocessing module 602. The first buffer 720 has a housing 721 and a plurality of supports 722. The supports 722 are arranged within the housing 721 and are spaced apart from each other in the vertical direction Z. One substrate W is placed on each support 722. The housing 721 has openings (not shown) on a side on which the interface robot 740 is provided and a side on which the preprocessing robot 632 is provided, such that the interface robot 740 and the preprocessing robot 632 carry the substrate W into or out of the support 722 in the housing 721. The second buffer 730 has a structure substantially similar to that of the first buffer 720. However, a housing of the second buffer 730 has openings (not shown) on a side on which the interface robot 740 is provided and a side on which the postprocessing robot 682 is provided. As described above, only the buffers and the robot may be provided in the interface module without a chamber for performing a certain process on the substrate.

Figure 5:
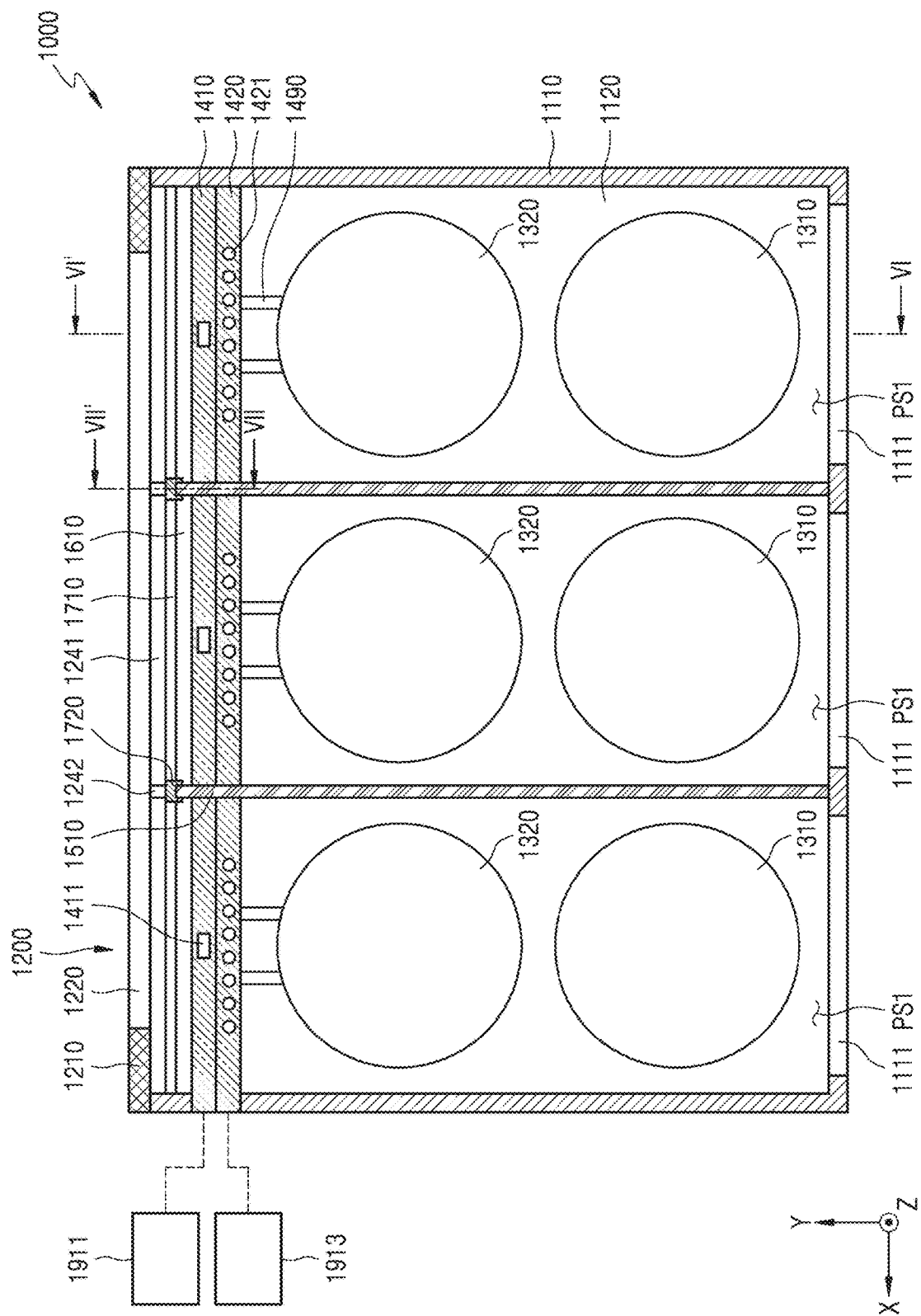
FIG. 5 is a plan view schematically illustrating a substrate processing apparatus according to an embodiment.
Figure 6:
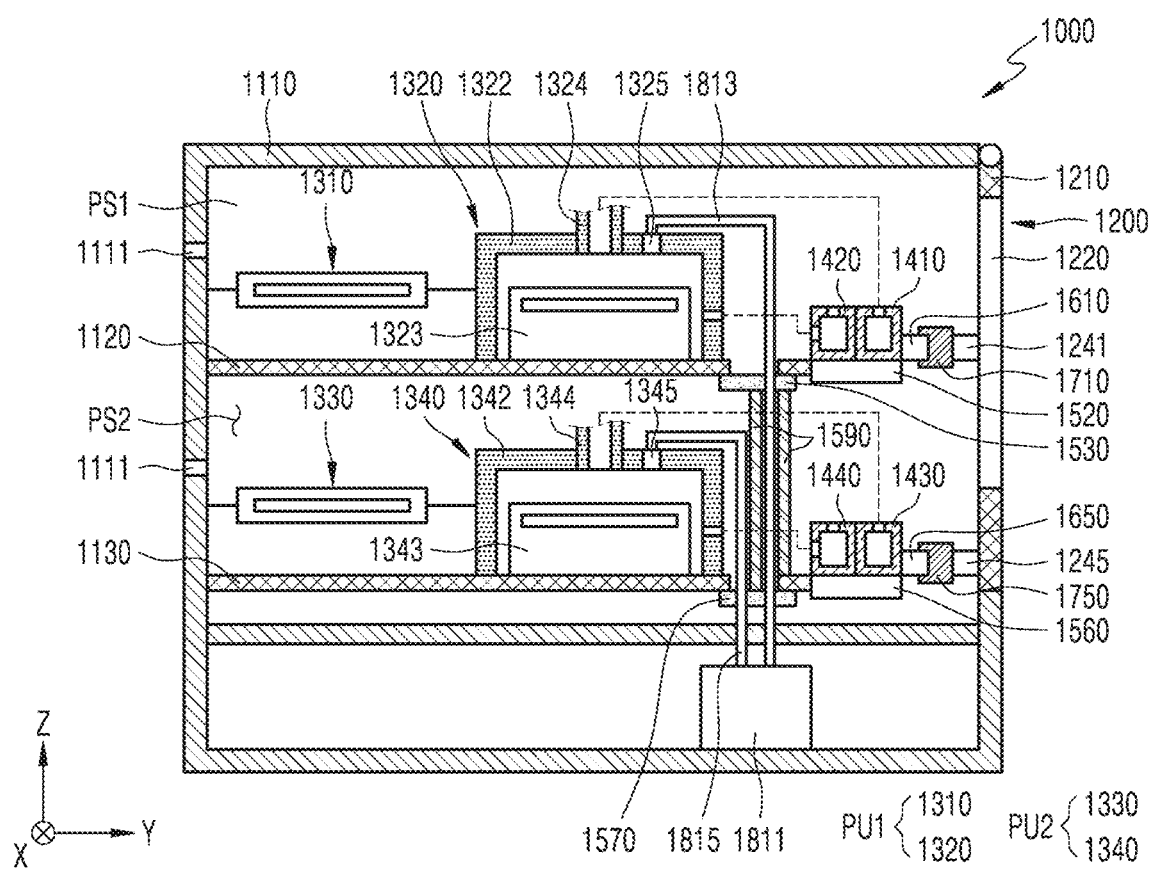
FIG. 6 is a cross-sectional view of the substrate processing apparatus of FIG. 5, taken along line VI-VI'.
Figure 7:
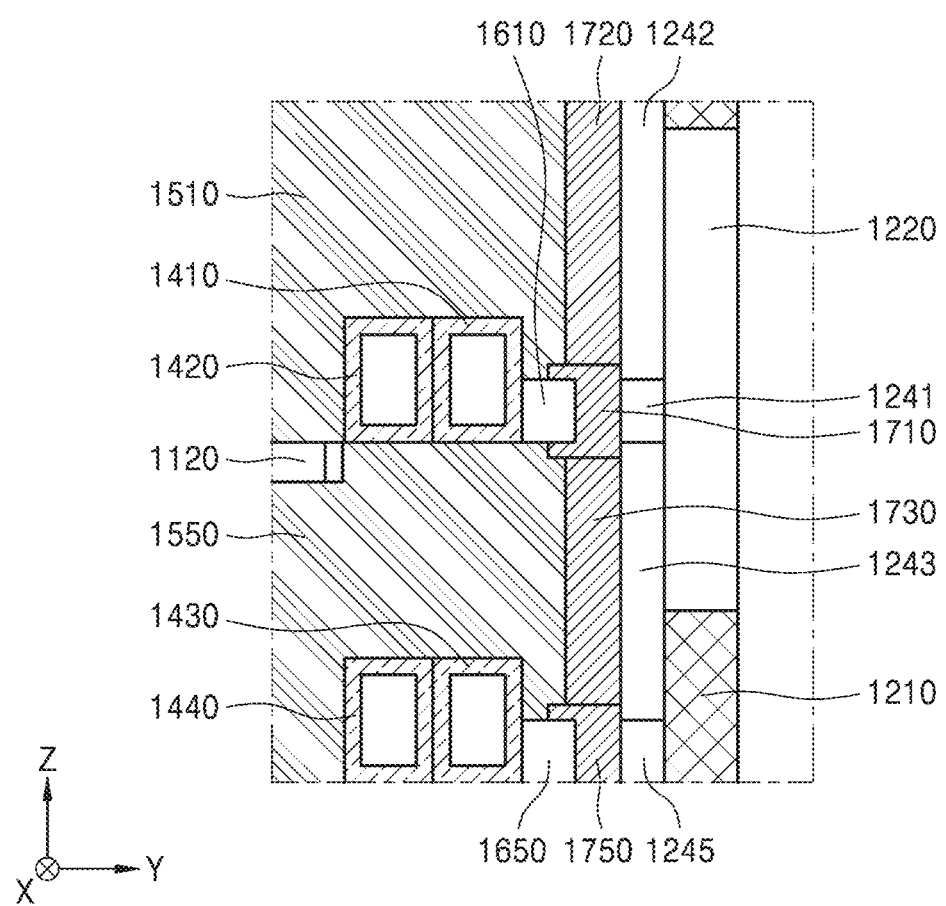
FIG. 7 is a cross-sectional view of the substrate processing apparatus of FIG. 5, taken along line VII-VII'.
Figure 8:
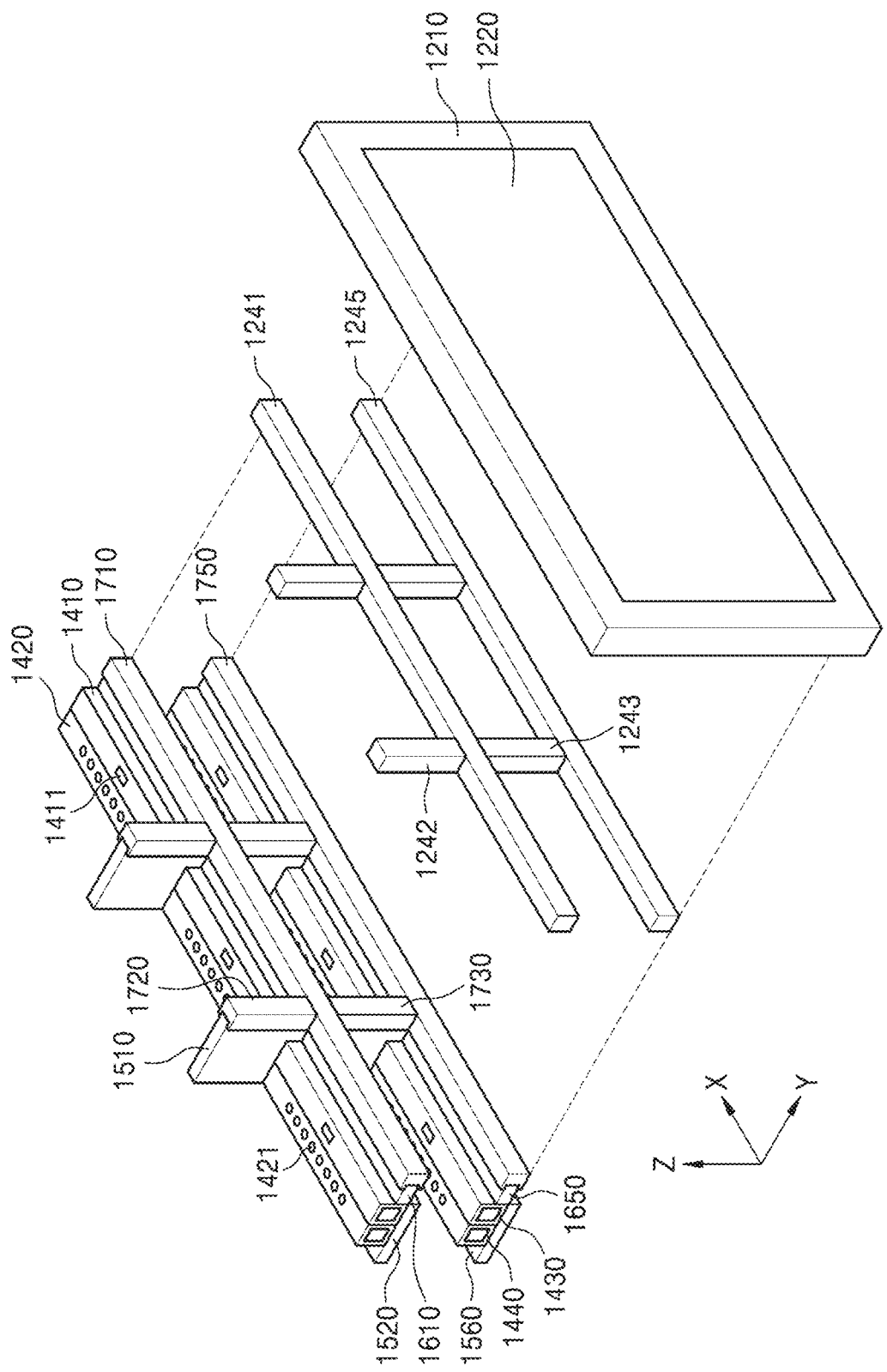
FIG. 8 is an exploded perspective view illustrating some components of the substrate processing apparatus of FIG. 5.
Figure 9:
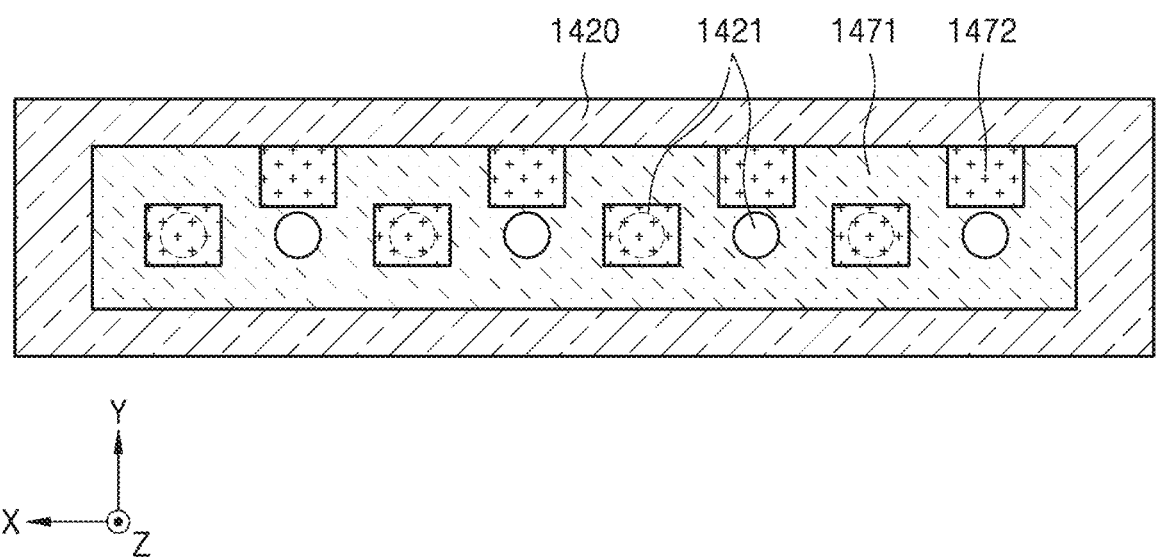
FIG. 9 is a plan view illustrating a second exhaust duct and a hole opening/closing block of a substrate processing apparatus.

FIG. 5 is a plan view schematically illustrating a substrate processing apparatus 1000 according to an embodiment. FIG. 6 is a cross-sectional view of the substrate processing apparatus 1000 of FIG. 5, taken along line VI-VI'. FIG. 7 is a cross-sectional view of the substrate processing apparatus 1000 of FIG. 5, taken along line VII-VII'. FIG. 8 is an exploded perspective view illustrating some components of the substrate processing apparatus 1000 of FIG. 5. FIG. 9 is a plan view illustrating a second exhaust duct 1420 and a hole opening/closing block 1471 of the substrate processing apparatus 1000.

Referring to FIGS. 5 to 9, the substrate processing apparatus 1000 may be configured to perform a heat treatment process on a substrate. The substrate processing apparatus 1000 may correspond to any one of the bake unit 420 of the coating module 401, the bake unit 470 of the developing module 402, the bake unit 620 of the preprocessing module 601, and the post-exposure bake unit 670 of the postprocessing module 602, which are described above with reference to FIGS. 1 to 4.

The substrate processing apparatus 1000 may include a bake chamber 1110, a chamber door 1200, a first support plate 1120, a first partition wall 1510, a first heat treatment module PU1, a first exhaust duct 1410, the second exhaust duct 1420, a first sealing bracket 1610, a first horizontal packing 1710, and a first vertical packing 1720.

The bake chamber 1110 may provide a space for processing a substrate. For example, the bake chamber 1110 may have a substantially rectangular parallelepiped shape. An entrance 1111 in the form of a slit and through which a substrate is carried in or taken out is provided in one sidewall of the bake chamber 1110, and an opening that is opened and closed by the chamber door 1200 may be formed in the other sidewall of the bake chamber 1110.

The chamber door 1200 is hinged to the bake chamber 1110 and is pivotable between an opening position for opening the opening of the bake chamber 1110 and a closing position for closing the opening of the bake chamber 1110, around the hinge axis. In other embodiments, the chamber door 1200 may be detachably mounted on the bake chamber 1110. The chamber door 1200 may be provided for maintenance of the inside of the bake chamber 1110. A door frame 1210 of the chamber door 1200 may include a window 1220 formed of a transparent material. For example, the window 1220 may include glass or transparent plastic, such as acrylic resin.

The first support plate 1120 is mounted in the bake chamber 1110 and may partition a space in the bake chamber 1110 into an upper space and a lower space. The first support plate 1120 may support the first heat treatment module PU1. A mounting surface (i.e., an upper surface) of the first support plate 1120 on which the first heat treatment module PU1 is mounted may be substantially parallel to the first horizontal direction X and the second horizontal direction Y.

The first partition wall 1510 may be arranged on the first support plate 1120, to partition a space provided on the first support plate 1120 into first heat treatment spaces PS1 spaced apart from each other in the first horizontal direction X. Each of the first heat treatment spaces PS1 may be defined as a space between two adjacent first partition walls 1510 or a space between the first partition wall 1510 and an inner surface of the bake chamber 1110. The first partition wall 1510 may be erected in a direction perpendicular to the mounting surface of the first support plate 1120 to block, between the first heat treatment spaces PS1, an airflow toward a transverse direction. The first partition wall 1510 may extend in the second horizontal direction Y and the vertical direction Z, on the first support plate 1120. The first partition wall 1510 may be in contact with the first exhaust duct 1410 and the second exhaust duct 1420, which are arranged adjacent to the chamber door 1200, and a packing member may be provided between the first partition wall 1510 and the first exhaust duct 1410 and between the first partition wall 1510 and the second exhaust duct 1420. FIG. 5 illustrates that three first heat treatment spaces PS1 separated from each other by two first partition walls 1510 are provided on the first support plate 1120. However, this is an example, and two, four, or more first heat treatment spaces PS1 separated from each other may be provided on the first support plate 1120.

The first heat treatment module PU1 configured to heat a substrate may be arranged in each of the first heat treatment spaces PS1 separated and partitioned by the first partition walls 1510. The first heat treatment module PU1 may include a first cooling stage 1310 and a first heating unit 1320, which are arranged on the first support plate 1120 in the second horizontal direction Y. The first cooling stage 1310 may have a cooler, such as cooling water or a thermoelectric element, and may cool a substrate mounted on the mounting surface. For example, the substrate mounted on the mounting surface of the first cooling stage 1310 may be cooled to a temperature equal to or close to the room temperature. The first heating unit 1320 may heat a substrate. The first heating unit 1320 may heat the substrate in the atmosphere of a normal pressure or a reduced pressure lower that normal pressure. Although not illustrated in the drawings, a substrate transfer robot configured to transfer a substrate between the first cooling stage 1310 and the first heating unit 1320 may be provided in each of the first heat treatment spaces PS1.

The first heating unit 1320 may include a first heating chamber 1322 including a first lower body and a first upper body, and a first heating stage 1323 provided in the first heating chamber 1322. The first upper body of the first heating chamber 1322 may move up and down between a closing position connected to the first lower body and an opening position spaced apart from the first lower body, by an elevating member. A first exhaust pipe 1324 for exhausting gas in the first heating chamber 1322 may be connected to the first upper body of the first heating chamber 1322. The first exhaust pipe 1324 may extend from an outlet port of the first upper body of the first heating chamber 1322 to an inlet port 1411 of the first exhaust duct 1410 to be described below, and the gas in the first heating chamber 1322 may be exhausted to the outside through the first exhaust pipe 1324 and the first exhaust duct 1410. The first upper body of the first heating chamber 1322 has an inlet port 1325 to which a first supply pipe 1813 for supplying processing gas into the first heating chamber 1322 is connected, and the processing gas provided from a gas supply 1811 may be supplied into the first heating chamber 1322 through the first supply pipe 1813. The first heating stage 1323 may have a heater, such as a hot wire or a thermoelectric element, and may heat the substrate mounted on the mounting surface.

The first exhaust duct 1410 may be mounted on the first support plate 1120 or a duct bracket extending from the first support plate 1120, and may be arranged adjacent to the chamber door 1200. The first exhaust duct 1410 may extend in the first horizontal direction X across the first heat treatment spaces PS1, and may be connected to an exhaust pump 1911 provided outside the bake chamber 1110. When the exhaust pump 1911 evacuates a flow path in the first exhaust duct 1410, gas containing contaminants, such as fumes, in the first heating chamber 1322 may be discharged to the outside through the first exhaust pipe 1324 and the first exhaust duct 1410.

The second exhaust duct 1420 may be provided on one side of the first exhaust duct 1410, and may be mounted on the first support plate 1120 or the duct bracket extending from the first support plate 1120. The second exhaust duct 1420 may extend in the first horizontal direction X across the first heat treatment spaces PS1, and may be connected to a depressurizing member 1913, such as a vacuum pump, provided outside the bake chamber 1110. A connection pipe 1490 for communicating a flow path in the second exhaust duct 1420 and an internal space of the first heating chamber 1322 may be provided between the second exhaust duct 1420 and an exhaust port provided in the first lower body of the first heating chamber 1322. The depressurizing member 1913 may exhaust gas in the internal space of the first heating chamber 1322 through the connection pipe 1490 and the second exhaust duct 1420, so as to control the atmosphere in the first heating chamber 1322, such as the pressure or temperature. For example, the depressurizing member 1913 may provide the atmosphere of a normal pressure or a reduced pressure lower than the normal pressure, in the first heating chamber 1322.

The second exhaust duct 1420 may include a plurality of communicating holes 1421 that communicate between the first heat treatment spaces PS1 and the flow path of the second exhaust duct 1420. When the depressurizing member 1913 depressurizes the flow path in the second exhaust duct 1420, an airflow toward the plurality of communicating holes 1421 is provided in the first heat treatment spaces PS1, and accordingly, airflow congestion in the first heat treatment spaces PS1 may be eliminated.

In embodiments, as illustrated in FIG. 9, the hole opening/closing block 1471 configured to open and close the plurality of communicating holes 1421 of the second exhaust duct 1420 may be provided on the second exhaust duct 1420. The hole opening/closing block 1471 may include a plurality of sub-opening/closing blocks 1472 responsible for opening and closing the plurality of communicating holes 1421. For example, some of the plurality of communicating holes 1421 may be closed, and the other of the plurality of communicating holes 1421 may be opened, by the plurality of sub-opening/closing blocks 1472. Opening/closing operations by the plurality of sub-opening/closing blocks 1472 may be automatically controlled by an actuator, or may be implemented by an operator.

The first sealing bracket 1610 may be coupled to one side of the first exhaust duct 1410 facing the chamber door 1200. The first sealing bracket 1610 may extend in the first horizontal direction X across the first heat treatment spaces PS1. The first sealing bracket 1610 may extend in the first horizontal direction X along the first exhaust duct 1410, and may extend from one end to the other end of the first exhaust duct 1410.

The first horizontal packing 1710 may be provided between the first sealing bracket 1610 and the chamber door 1200 to seal a gap between the first sealing bracket 1610 and the chamber door 1200. The first horizontal packing 1710 may extend in the first horizontal direction X from one end to the other end of the first sealing bracket 1610. A first horizontal block 1241 having a shape and length corresponding to the shape and length of the first sealing bracket 1610 may be provided on the inner surface of the door frame 1210. The first horizontal packing 1710 may be in continuous contact with each of the first sealing bracket 1610 and the first horizontal block 1241, in the direction in which the first horizontal packing 1710 extends. The first horizontal packing 1710 may be provided between the first sealing bracket 1610 and the first horizontal block 1241, and may be fixedly coupled to any one of the first sealing bracket 1610 and the first horizontal block 1241. For example, the first horizontal packing 1710 may be fixedly coupled to the first sealing bracket 1610 and be in close contact with the first horizontal block 1241 to seal between the first sealing bracket 1610 and the first horizontal block 1241.

The first vertical packing 1720 may be provided between the first partition wall 1510 and the chamber door 1200 to seal a gap between the first partition wall 1510 and the chamber door 1200. The first vertical packing 1720 may extend in the vertical direction Z along an edge of the first partition wall 1510 facing the chamber door 1200. The first vertical packing 1720 may extend in the vertical direction Z from the lower end to the upper end of the edge of the first partition wall 1510. A first vertical block 1242 having a length corresponding to the length of the first partition wall 1510 may be provided on the inner surface of the door frame 1210. The first vertical packing 1720 may be in continuous contact with each of the first partition wall 1510 and the first vertical block 1242, in the direction in which the first vertical packing 1720 extends. The first vertical packing 1720 may be provided between the first partition wall 1510 and the first vertical block 1242, and may be fixedly coupled to any one of the first partition wall 1510 and the first vertical block 1242. For example, the first vertical packing 1720 may be fixedly coupled to the edge of the first partition wall 1510 and be in close contact with the first vertical block 1242 to seal between the first partition wall 1510 and the first vertical block 1242.

The first horizontal packing 1710 and the first vertical packing 1720 may be directly connected to each other. In embodiments, the first horizontal packing 1710 and the first vertical packing 1720 may be integrally formed and made of the same material.

The first horizontal block 1241 and the first vertical block 1242 may be directly connected to each other. In embodiments, the first horizontal block 1241 and the first vertical block 1242 may be integrally formed, and made of the same material.

In addition, the substrate processing apparatus 1000 may further include a second support plate 1130, a second partition wall 1550, a second heat treatment module PU2, a third exhaust duct 1430, a fourth exhaust duct 1440, a second sealing bracket 1650, a second horizontal packing 1750, and a second vertical packing 1730.

The second support plate 1130 may be mounted in the bake chamber 1110 and may be provided on the lower side of the first support plate 1120. The second support plate 1130 may support the second heat treatment module PU2. A mounting surface (i.e., an upper surface) of the second support plate 1130 on which the second heat treatment module PU2 is mounted may be substantially parallel to the first horizontal direction X and the second horizontal direction Y.

The second partition wall 1550 may be arranged on the second support plate 1130, to partition a space provided on the second support plate 1130 into second heat treatment spaces PS2 spaced apart from each other in the first horizontal direction X. Each of the second heat treatment spaces PS2 may be defined as a space between two adjacent second partition walls 1550 or a space between the second partition wall 1550 and the inner surface of the bake chamber 1110. The second partition wall 1550 may be erected in a direction perpendicular to the mounting surface of the second support plate 1130 to block, between the second heat treatment spaces PS2, an airflow toward a transverse direction. The second partition wall 1550 may extend in the second horizontal direction Y and the vertical direction Z on the second support plate 1130, the lower end of the second partition wall 1550 may be in contact with the second support plate 1130, and the upper end of the second partition wall 1550 may be in contact with the first support plate 1120. The second partition wall 1550 may be in contact with the third exhaust duct 1430 and the fourth exhaust duct 1440, which are arranged adjacent to the chamber door 1200, and a packing member may be provided between the second partition wall 1550 and the third exhaust duct 1430 and between the second partition wall 1550 and the fourth exhaust duct 1440.

The second heat treatment module PU2 configured to heat a substrate may be arranged in each of the second heat treatment spaces PS2 separated and partitioned by the second partition walls 1550. The second heat treatment module PU2 may include a second cooling stage 1330 and a second heating unit 1340, which are arranged in the second horizontal direction Y on the second support plate 1130. Although not illustrated in the drawings, a substrate transfer robot configured to transfer a substrate between the second cooling stage 1330 and the second heating unit 1340 may be provided in each of the second heat treatment spaces PS2.

The second heating unit 1340 may include a second heating chamber 1342 including a second lower body and a second upper body, and a second heating stage 1343 provided in the second heating chamber 1342. The configuration of the second heating chamber 1342 may be substantially the same as or similar to that of the above-described first heating chamber 1322, and the second heating stage 1343 may be substantially the same as or similar to that of the above-described first heating stage 1323, and thus, detailed descriptions thereof will be omitted. A second exhaust pipe 1344 for exhausting gas in the second heating chamber 1342 may be connected to the second upper body of the second heating chamber 1342, and the second exhaust pipe 1344 may extend from an outlet port of the second upper body of the second heating chamber 1342 to an inlet port of the third exhaust duct 1430 to be described below. A second supply pipe 1815 that delivers processing gas provided from the gas supply 1811 may be connected to an inlet port 1345 of the second upper body of the second heating chamber 1342.

The third exhaust duct 1430 may be mounted on the second support plate 1130 or a duct bracket extending from the second support plate 1130, and may be arranged adjacent to the chamber door 1200. The third exhaust duct 1430 may extend in the first horizontal direction X across the second heat treatment spaces PS2, and may be connected to the exhaust pump 1911 provided outside the bake chamber 1110. When the exhaust pump 1911 evacuates a flow path in the second exhaust duct 1420, gas containing contaminants, such as fumes, in the second heating chamber 1342 may be discharged to the outside through the second exhaust pipe 1344 and the third exhaust duct 1430.

The fourth exhaust duct 1440 may be provided on one side of the third exhaust duct 1430, and may be mounted on the second support plate 1130 or the duct bracket extending from the second support plate 1130. The fourth exhaust duct 1440 may extend in the first horizontal direction X across the second heat treatment spaces PS2, and may be connected to the depressurizing member 1913 provided outside the bake chamber 1110. A connection pipe for communicating a flow path in the fourth exhaust duct 1440 and an internal space of the second heating chamber 1342 may be provided between the fourth exhaust duct 1440 and an exhaust port provided in the second lower body of the second heating chamber 1342. The depressurizing member 1913 may exhaust gas in the internal space of the second heating chamber 1342 through the fourth exhaust duct 1440 and the connection pipe extending between the fourth exhaust duct 1440 and the second heating chamber 1342, so as to control the atmosphere in the second heating chamber 1342, such as the pressure or temperature.

The fourth exhaust duct 1440 may include a plurality of communicating holes that communicate between the second heat treatment spaces PS2 and the flow path of the fourth exhaust duct 1440. When the depressurizing member 1913 depressurizes the flow path in the fourth exhaust duct 1440, an airflow toward the plurality of communicating holes is provided in the second heat treatment spaces PS2, and accordingly, airflow congestion in the second heat treatment spaces PS2 may be eliminated. In addition, similar to the hole opening/closing block 1471 described above with reference to FIG. 9, a hole opening/closing block configured to open and close the plurality of communicating holes of the fourth exhaust duct 1440 may be further provided on the fourth exhaust duct 1440.

The second sealing bracket 1650 may be coupled to one side of the third exhaust duct 1430 facing the chamber door 1200. The second sealing bracket 1650 may extend in the first horizontal direction X across the second heat treatment spaces PS2. The second sealing bracket 1650 may extend in the first horizontal direction X along the second exhaust duct 1420, and may extend from one end to the other end of the second exhaust duct 1420.

The second horizontal packing 1750 may be provided between the second sealing bracket 1650 and the chamber door 1200 to seal a gap between the second sealing bracket 1650 and the chamber door 1200. The second horizontal packing 1750 may extend in the first horizontal direction X from one end to the other end of the second sealing bracket 1650. A second horizontal block 1245 having a shape and length corresponding to the shape and length of the second sealing bracket 1650 may be provided on the inner surface of the door frame 1210. The second horizontal packing 1750 may be in continuous contact with each of the second sealing bracket 1650 and the second horizontal block 1245, in the direction in which the second horizontal packing 1750 extends. The second horizontal packing 1750 may be provided between the second sealing bracket 1650 and the second horizontal block 1245, and may be fixedly coupled to any one of the second sealing bracket 1650 and the second horizontal block 1245. For example, the second horizontal packing 1750 may be fixedly coupled to the second sealing bracket 1650 and be in close contact with the second horizontal block 1245 to seal between the second sealing bracket 1650 and the second horizontal block 1245.

The second vertical packing 1730 may be provided between the second partition wall 1550 and the chamber door 1200 to seal a gap between the second partition wall 1550 and the chamber door 1200. The second vertical packing 1730 may extend in the vertical direction Z along an edge of the second partition wall 1550 facing the chamber door 1200. The second vertical packing 1730 may extend in the vertical direction Z from the lower end to the upper end of the edge of the second partition wall 1550. A second vertical block 1243 having a length corresponding to the length of the second partition wall 1550 may be provided on the inner surface of the door frame 1210. The second vertical packing 1730 may be in continuous contact with each of the second partition wall 1550 and the second vertical block 1243, in the direction in which the second vertical packing 1730 extends. The second vertical packing 1730 may be provided between the second partition wall 1550 and the second vertical block 1243, and may be fixedly coupled to any one of the second partition wall 1550 and the second vertical block 1243. For example, the second vertical packing 1730 may be fixedly coupled to the edge of the second partition wall 1550 and be in close contact with the second vertical block 1243 to seal between the second partition wall 1550 and the second vertical block 1243.

The second horizontal packing 1750 and the second vertical packing 1730 may be directly connected to each other. In embodiments, the second horizontal packing 1750 and the second vertical packing 1730 may be integrally formed and made of the same material. Furthermore, the upper end of the second vertical packing 1730 may be connected to the first horizontal packing 1710. In embodiments, the first horizontal packing 1710, the first vertical packing 1720, the second horizontal packing 1750, and the second vertical packing 1730 may be integrally formed and made of the same material.

The second horizontal block 1245 and the second vertical block 1243 may be directly connected to each other. In embodiments, the second horizontal block 1245 and the second vertical block 1243 may be integrally formed and made of the same material. Furthermore, the upper end of the second vertical block 1243 may be connected to the first horizontal block 1241. In embodiments, the first horizontal block 1241, the first vertical block 1242, the second horizontal block 1245, and the second vertical block 1243 may be integrally formed and made of the same material.

In embodiments, a first separation plate 1520 configured to block an airflow toward the vertical direction Z in a region adjacent to the chamber door 1200 may be provided below the first exhaust duct 1410 and the second exhaust duct 1420. That is, the first separation plate 1520 may block an airflow between the first heat treatment space PS1 provided on the upper side of the first support plate 1120 and the second heat treatment space PS2 provided on the lower side of the first support plate 1120. The first separation plate 1520 may be connected to an edge of the first support plate 1120 facing the chamber door 1200, and a packing member may be provided between the first separation plate 1520 and the first support plate 1120. The first separation plate 1520 may be fixedly coupled to the bottom surface of the first exhaust duct 1410 and/or the bottom surface of the second exhaust duct 1420, and may extend from one end to the other end of the first exhaust duct 1410, in the first horizontal direction X.

In embodiments, a second separation plate 1560 configured to block an airflow toward the vertical direction Z in a region adjacent to the chamber door 1200 may be provided below the third exhaust duct 1430 and the fourth exhaust duct 1440. That is, the second separation plate 1560 may block an airflow between the second heat treatment space PS2 provided on the upper side of the second support plate 1130, and another space provided on the lower side of the second support plate 1130. The second separation plate 1560 may be connected to an edge of the second support plate 1130 facing the chamber door 1200, and a packing member may be provided between the second separation plate 1560 and the second support plate 1130. The second separation plate 1560 may be fixedly coupled to the bottom surface of the third exhaust duct 1430 and/or the bottom surface of the fourth exhaust duct 1440, and may extend from one end to the other end of the third exhaust duct 1430, in the first horizontal direction X.

The first support plate 1120 may include an opening through which the first supply pipe 1813 passes, and the second support plate 1130 may include an opening through which the first supply pipe 1813 and the second supply pipe 1815 pass. In embodiments, a first sealing block 1530, which covers and closes the opening of the first support plate 1120 and includes a pipe passage hole through which the first supply pipe 1813 passes, may be mounted on the first support plate 1120, and a second sealing block 1570, which covers and closes the opening of the second support plate 1130 and includes pipe passage holes through which the first supply pipe 1813 and the second supply pipe 1815 pass, may be mounted on the second support plate 1130. The first sealing block 1530 may block an airflow toward the vertical direction Z and through the opening of the first support plate 1120, and the second sealing block 1570 may block an airflow toward the vertical direction Z and through the opening of the second support plate 1130. The size of the pipe passage hole of the first sealing block 1530 may be substantially similar to the size of the first supply pipe 1813, and the size of the pipe passage hole of the second sealing block 1570 may be substantially similar to the size of the first supply pipe 1813 or the size of the second supply pipe 1815. The number of pipe passage holes provided in the first sealing block 1530 may be greater than the number of first supply pipes 1813 passing through the first sealing block 1530, and in this case, the pipe passage hole of the first sealing block 1530 into which the first supply pipe 1813 is not inserted may be closed by a separate block. Similarly, the number of pipe passage holes provided in the second sealing block 1570 is greater than the sum of the number of first supply pipes 1813 and the number of second supply pipes 1815, which pass through the second sealing block 1570, and in this case, the pipe passage hole of the second sealing block 1570 into which the first supply pipe 1813 or the second supply pipe 1815 is not inserted may be closed by a separate block.

In embodiments, a pipe separation membrane 1590 for separating the first supply pipe 1813 and the second supply pipe 1815 from each other may be provided between the first support plate 1120 and the second support plate 1130. The pipe separation membrane 1590 may extend in the vertical direction Z from the first support plate 1120 to the second support plate 1130, and may have a tubular shape surrounding the first supply pipe 1813 or a flat plate shape erected between the first supply pipe 1813 and the second heat treatment module PU2. The pipe separation membrane 1590 may separate a path through which the first supply pipe 1813 passes and a path through which the second supply pipe 1815 passes, from each other. In addition, the pipe separation membrane 1590 may be arranged between the second supply pipe 1815 and the second heat treatment module PU2 to prevent gas leaked out of the opening of the first support plate 1120 from flowing toward the second heat treatment module PU2.

According to embodiments, an airflow toward a transverse direction and between the heat treatment spaces adjacent to each other in the transverse direction in the bake chamber 1110 may be blocked by the partition walls and the vertical packings, and thus, the atmosphere of the heat treatment spaces adjacent to each other in the transverse direction may be uniformly controlled.

In addition, according to embodiments, each heat treatment space provided in the bake chamber 1110 may communicates with the internal flow path of the exhaust duct through the communicating hole of the exhaust duct, and an airflow toward the communicating hole 1421 of the depressurized exhaust duct may be provided in each heat treatment space. Accordingly, airflow congestion phenomenon in each heat treatment space may be eliminated, and thus, the atmosphere in each heat treatment space may be uniformly controlled. Furthermore, the airflow toward the communicating hole 1421 of the depressurized exhaust duct has a relatively high flow rate, and thus, generation of turbulence that causes nonuniformity of airflow may be suppressed.

In addition, according to embodiments, an airflow toward the vertical direction Z in the bake chamber 1110 (e.g., an upward airflow caused by heat) may be blocked or suppressed by a sealing plate, a horizontal packing, a separation plate, and/or a sealing block, and thus, the atmosphere of each heat treatment space may be uniformly controlled.

Ultimately, according to embodiments, the reliability of substrate processing may be improved by controlling an airflow in the bake chamber 1110 and thus uniformly controlling the atmosphere of each heat treatment space.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus comprising:
a bake chamber;
a chamber door that opens and closes an opening of the bake chamber;
a first support plate provided in the bake chamber;
a first partition wall, which partitions a space provided on the first support plate into first heat treatment spaces spaced apart from each other in a first horizontal direction, and extends on the first support plate in a second horizontal direction and a vertical direction, wherein the second horizontal direction is perpendicular to the first horizontal direction, and the vertical direction is perpendicular to the first horizontal direction and the second horizontal direction;
first heat treatment modules, which are arranged in the first heat treatment spaces and comprise first heating stages on which substrates are mounted, respectively;
a first exhaust duct extending in the first horizontal direction across the first heat treatment spaces and through which gas exhausted from the first heat treatment modules is introduced;
a first sealing bracket, which is coupled to the first exhaust duct and extends in the first horizontal direction along the first exhaust duct;
a first horizontal packing, which extends in the first horizontal direction along the first sealing bracket and is configured to seal a gap between the first sealing bracket and the chamber door; and
a first vertical packing, which extends in the vertical direction along an edge of the first partition wall facing the chamber door and is configured to seal a gap between the first partition wall and the chamber door.

2. The substrate processing apparatus of claim 1, wherein the chamber door comprises:
a door frame;
a first horizontal block, which is provided on an inner surface of the door frame and is in close contact with the first horizontal packing; and
a first vertical block, which is provided on the inner surface of the door frame and is in close contact with the first vertical packing.

3. The substrate processing apparatus of claim 1, further comprising a second exhaust duct provided on one side of the first exhaust duct,
wherein the second exhaust duct comprises a plurality of communicating holes that communicate between a flow path provided in the second exhaust duct and the first heat treatment spaces.

4. The substrate processing apparatus of claim 3, further comprising
a hole opening/closing block provided on the second exhaust duct to open and close the plurality of communicating holes of the second exhaust duct.

5. The substrate processing apparatus of claim 1, further comprising:
a second support plate provided below the first support plate;
a second partition wall, which partitions a space provided between the first support plate and the second support plate into second heat treatment spaces spaced apart from each other in the first horizontal direction, and extends in the second horizontal direction and the vertical direction;
second heat treatment modules, which are arranged in the second heat treatment spaces and comprise second heating stages on which substrates are mounted, respectively; and
a second vertical packing, which extends in the vertical direction along an edge of the second partition wall facing the chamber door and is configured to seal a gap between the second partition wall and the chamber door.

6. The substrate processing apparatus of claim 5, wherein the chamber door comprises:
a door frame; and
a second vertical block, which is provided on an inner surface of the door frame and is in close contact with the second vertical packing.

7. The substrate processing apparatus of claim 5, further comprising a first separation plate, which is provided below the first exhaust duct and is configured to block an airflow between the first heat treatment spaces and the second heat treatment spaces.

8. The substrate processing apparatus of claim 5, further comprising:
a first supply pipe, which is configured to deliver processing gas to a first chamber in which the first heating stage is accommodated, and extends through an opening of the first support plate and an opening of the second support plate; and
a second supply pipe, which is configured to deliver processing gas to a second chamber in which the second heating stage is accommodated, and extends through the opening of the second support plate.

9. The substrate processing apparatus of claim 8, further comprising:
a first sealing block, which is coupled to the first support plate to cover the opening of the first support plate, and comprises a pipe passage hole through which the first supply pipe passes; and
a second sealing block, which is coupled to the second support plate to cover the opening of the second support plate, and comprises pipe passage holes through which the first supply pipe and the second supply pipe pass.

10. The substrate processing apparatus of claim 8, further comprising a pipe separation membrane, which extends in the vertical direction between the first support plate and the second support plate, and is arranged between the first supply pipe and the second supply pipe.

11. The substrate processing apparatus of claim 5, wherein each of the first heat treatment modules further comprises a first cooling stage on which a substrate is mounted, and
each of the second heat treatment modules further comprises a second cooling stage on which a substrate is mounted.

12. A substrate processing apparatus comprising:
a bake chamber;
a chamber door that opens and closes an opening of the bake chamber;
a first support plate provided in the bake chamber;
a heating unit, which is arranged in a first heat treatment space provided on the first support plate and comprises a first heating stage configured to heat a substrate and a first heating chamber accommodating the first heating stage;

a first exhaust duct, which is connected to a first exhaust pipe connected to an upper side of the first heating chamber and discharges gas introduced through the first exhaust pipe to the outside;

a second exhaust duct, which is provided on one side of the first exhaust duct and comprises a plurality of communicating holes that communicate between the first heat treatment space and an inner flow path provided in the second exhaust duct;

a connection pipe, which extends between the second exhaust duct and the first heating chamber to communicate between the inner flow path of the second exhaust duct and a space in the first heating chamber;

a sealing bracket, which is coupled to one side of the first exhaust duct facing the chamber door and extends in a direction in which the first exhaust duct extends; and a horizontal packing, which extends along the sealing bracket and is configured to seal a gap between the sealing bracket and the chamber door.

13. The substrate processing apparatus of claim 12, further comprising a first partition wall erected in the vertical direction on the first support plate to partition the first heat treatment space into a plurality of spaces,
  wherein the first partition wall is connected to the first exhaust duct and the second exhaust duct, and
  a first vertical packing configured to seal a gap between the chamber door and the first partition wall is coupled to an edge of the first partition wall facing the chamber door.

14. The substrate processing apparatus of claim 12, further comprising a hole opening/closing block provided on the second exhaust duct to open and close the plurality of communicating holes of the second exhaust duct.

15. The substrate processing apparatus of claim 12, further comprising a cooling stage, which is arranged in the first heat treatment space provided on the first support plate, and is configured to cool the substrate.

16. The substrate processing apparatus of claim 12, further comprising:
  a second support plate provided below the first support plate;
  a second heating unit, which is arranged in a second heat treatment space provided between the first support plate and the second support plate, and comprises a second heating stage configured to heat a substrate and a second heating chamber accommodating the second heating stage;
  a third exhaust duct, which is connected to a second exhaust pipe connected to an upper side of the first heating chamber and discharges gas introduced through the second exhaust pipe to the outside; and
  a fourth exhaust duct, which is provided on one side of the third exhaust duct and comprises a plurality of communicating holes that communicate between the second heat treatment space and an inner flow path provided in the fourth exhaust duct.

17. The substrate processing apparatus of claim 16, further comprising a second partition wall erected in the vertical direction on the second support plate to partition the second heat treatment space into a plurality of spaces,
  wherein the second partition wall is connected to the third exhaust duct and the fourth exhaust duct, and
  a second vertical packing configured to seal a gap between the chamber door and the second partition wall is coupled to an edge of the second partition wall facing the chamber door.

18. The substrate processing apparatus of claim 16, further comprising:
  a first supply pipe, which is configured to deliver processing gas to the first heating chamber, and extends through an opening of the first support plate and an opening of the second support plate;
  a second supply pipe, which is configured to deliver processing gas to the second heating chamber, and extends through the opening of the second support plate;
  a first sealing block, which is coupled to the first support plate to cover the opening of the first support plate, and comprises a pipe passage hole through which the first supply pipe passes; and
  a second sealing block, which is coupled to the second support plate to cover the opening of the second support plate, and comprises pipe passage holes through which the first supply pipe and the second supply pipe pass.

19. A substrate processing apparatus comprising:
  a bake chamber;
  a chamber door that opens and closes an opening of the bake chamber;
  a first support plate provided in the bake chamber;
  a first partition wall, which partitions a space provided on the first support plate into first heat treatment spaces spaced apart from each other in a first horizontal direction, and extends on the first support plate in a second horizontal direction and a vertical direction, wherein the second horizontal direction is perpendicular to the first horizontal direction, and the vertical direction is perpendicular to the first horizontal direction and the second horizontal direction;
  first heat treatment modules, which are arranged in the first heat treatment spaces, each of the first heat treatment modules comprising a first cooling stage configured to cool a substrate and a first heating stage configured to heat the substrate;
  a first exhaust duct extending in the first horizontal direction across the first heat treatment spaces and through which gas exhausted from the first heat treatment modules is introduced;
  a second exhaust duct, which extends in the first horizontal direction across the first heat treatment spaces and comprises a plurality of communicating holes that communicate between a flow path provided in the second exhaust duct and the first heat treatment spaces;
  a first sealing bracket, which is coupled to the first exhaust duct and extends in the first horizontal direction along the first exhaust duct;
  a first horizontal packing, which extends in the first horizontal direction along the first sealing bracket and is configured to seal a gap between the first sealing bracket and the chamber door;
  a first vertical packing, which extends in the vertical direction along an edge of the first partition wall facing the chamber door and is configured to seal a gap between the first partition wall and the chamber door;
  a second support plate provided below the first support plate;
  a second partition wall, which partitions a space provided between the first support plate and the second support plate into second heat treatment spaces spaced apart from each other in the first horizontal direction, and extends in the second horizontal direction and the vertical direction;

second heat treatment modules, which are arranged in the second heat treatment spaces, each of the second heat treatment modules comprising a second cooling stage configured to cool a substrate and a second heating stage configured to heat the substrate; and a second vertical packing, which extends in the vertical direction along an edge of the second partition wall facing the chamber door and is configured to seal a gap between the second partition wall and the chamber door.

20. The substrate processing apparatus of claim 19, wherein the chamber door comprises:

a first horizontal block in close contact with the first horizontal packing;

a first vertical block, which is in close contact with the first vertical packing and is connected to the first horizontal block; and a second vertical block, which is in close contact with the second vertical packing and is connected to the first horizontal block, wherein the first horizontal packing is in continuous contact with each of the first sealing bracket and the first horizontal block, in a direction in which the first horizontal packing extends, the first vertical packing is in continuous contact with each of the first partition wall and the first vertical block, in a direction in which the first vertical packing extends, the second vertical packing is in continuous contact with each of the second partition wall and the second vertical block, in a direction in which the second vertical packing extends, and the first vertical packing and the second vertical packing are each directly connected to the first horizontal packing.

* * * * *